PRODUCTION OF HIGH SPEED COMPLEMENTARY TRANSISTORS

Filed Nov. 15, 1971 3 Sheets-Sheet 1

PRODUCTION OF HIGH SPEED COMPLEMENTARY TRANSISTORS

Filed Nov. 15, 1971

United States Patent Office 3,752,715
Patented Aug. 14, 1973

3,752,715

PRODUCTION OF HIGH SPEED COMPLEMENTARY TRANSISTORS

Igor Antipov, Pleasant Valley, and Avtar S. Oberai, Wappingers Falls, N.Y., assignors to International Business Machines Corporation, Armonk, N.Y.

Filed Nov. 15, 1971, Ser. No. 198,593
Int. Cl. H01l 7/44, 7/64
U.S. Cl. 148—187 6 Claims

ABSTRACT OF THE DISCLOSURE

Complementary NPN and PNP transistors are prepared simultaneously which have properties of a high frequency response. Selected impurity concentrations are employed whereby the second emitter diffusion is performed with the first emitter area unmasked. This eliminates any emitter contact opening step such that each contact area and emitter are co-extensive. Other circuit components such as resistors and diodes are also formed during the formation of the NPN and PNP transistors.

BACKGROUND OF THE INVENTION

This invention relates generally to integrated circuit devices and more particularly to the simultaneous preparation of high speed, complementary transistors.

In the preparation of integrated circuit devices where electronic circuit elements such as resistors, capacitors, diodes, and transistors are formed in a body of semiconductor material, it is sometimes desirable to provide circuit elements of a complementary nature have compatible response characteristics. Such elements have been simultaneously formed in the past with the object of providing elements having more or less matched performance while using a minimum number of additional process steps over the steps required to produce a single transistor. This has been achieved in the past only at the sacrifice of overall performance characteristics.

BRIEF SUMMARY OF THE INVENTION

We have now found a process by which complementary circuit elements are simultaneously formed with a minimum of additional process steps and which have improved performance characteristics including a high frequency response.

In accordance with this invention, in the process of making integrated circuit devices by conducting a series of masking and diffusion steps to simultaneously form complementary devices, a diffusion to form a first area of one conductivity type for one device is performed while leaving unmasked a second area of opposite conductivity type of the complementary device. The impurity concentrations of the diffusion and unmasked area are selected such that the conductivity type of the unmasked second area remains unchanged.

The process forms complementary NPN and PNP transistors with the emitter contact areas co-extensive with the emitters by performing the diffusion of the second emitter area with the first emitter area unmasked.

DETAILED DESCRIPTION

Figure 1:
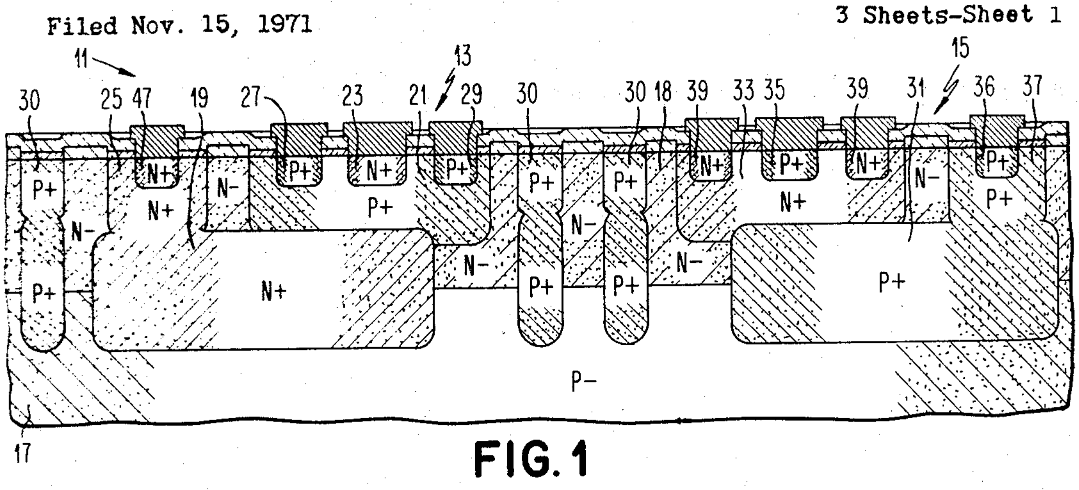
FIG. 1 is a schematic sectional view illustrating complementary NPN and PNP transistors fabricated in accordance with the present invention.
Figure 2:
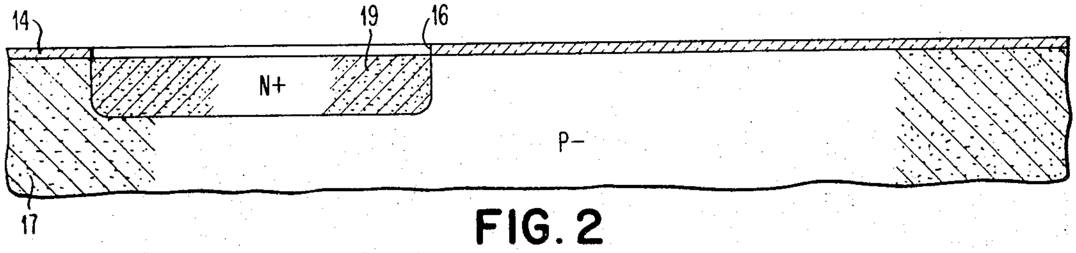
FIGS. 2–8 are schematic cross sections illustrating the steps of an embodiment of the process invention utilized in fabricating the device of FIG. 1.

Turning now to FIG. 1 an integrated circuit device 11 having complementary NPN and PNP transistors 13 and 15 respectively which are formed in accordance with the process of the invention is illustrated.

Circuit 11 is formed in a $P^-$ type substrate 17 (which could be an epitaxial layer) with an overlying $N^-$ type epitaxial layer 18. NPN transistor 13 comprises three diffused regions including an $N^+$ type collector region 19, a $P^+$ type base region 21 and $N^+$ type emitter region 23. A collector contact region 25 of $N^+$ type and base contact regions 27 and 29 of $P^+$ type are provided. Transistors 13 and 15 are electrically isolated by $P^+$ type diffused isolation regions 30 which extend from the surface of the device into the substrate 17. PNP transistor 15 comprises three diffused regions including $P^+$ type collector region 31, $N^+$ type base region 33 and $P^+$ type emitter region 35. $P^+$ type collector contact region 37 and $N^+$ type base contact regions 39 are also provided. Transistors 13 and 15 each have a narrow base, shallow structure which provides for good base width control and a high frequency response ($F_T$ for PNP (1 ma.)=1.1–1.6 gHz. minimum to maximum with a 1.38 gHz. with nominal base width).

The process steps for the formation of integrated circuit device 11 are illustrated in FIGS. 2–8. Silicon substrate 17 is of the P type 2 ohm-centimeter (100) orientation. The surface is oxidized by the conventional thermal oxide process at about 973° C. to form a $SiO_2$ layer 14 of about 4,000 angstroms in thickness and the oxide is opened at 16 by the conventional photolithographic and etching process for subcollector 19 diffusion. The $N^+$ subcollector 19 having a concentration $C_0$ of $4.9\times10^{20}$ a./cm.$^3$ of arsenic for transistor 13 is formed by diffusing arsenic through opening 16 into substrate 17 using a conventional capsule diffusion technique from a silicon-arsenic source. The process temperature is about 1105° C. with a diffusion time of about 80 minutes. The resulting sheet resistance is about 5.8 ohms/cm.$^2$. A 5000 angstrom thick oxide layer 20 is then grown to close opening 16.

Figure 3:
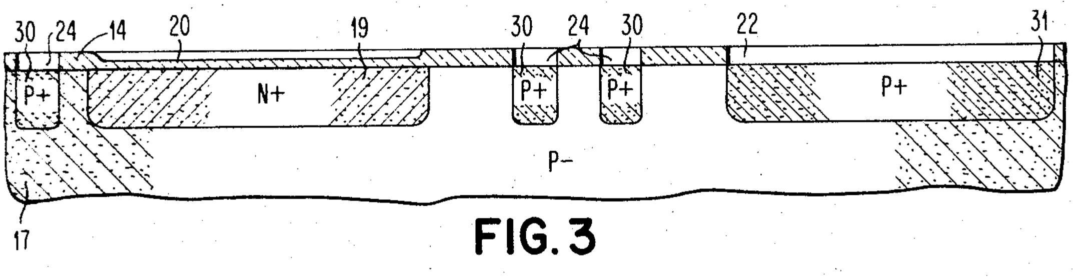

Openings 22 for $P^+$ subcollector region 31 of transistor 15 and openings 24 for $P^+$ isolation diffusion regions 30 are formed in layer 14 by photolithographic and etching techniques (FIG. 3). Regions 30 and 31 are diffused with a concentration of $7\times10^{19}$ a./cm.$^3$ of boron by diffusing boron through openings 22 and 24 into substrate 17 using a conventional capsule diffusion technique and a silicon-boron source at a temperature of about 1105° C. for 185 minutes. The resulting sheet resistance is about 29 ohms/cm.$^2$.

Figure 4:
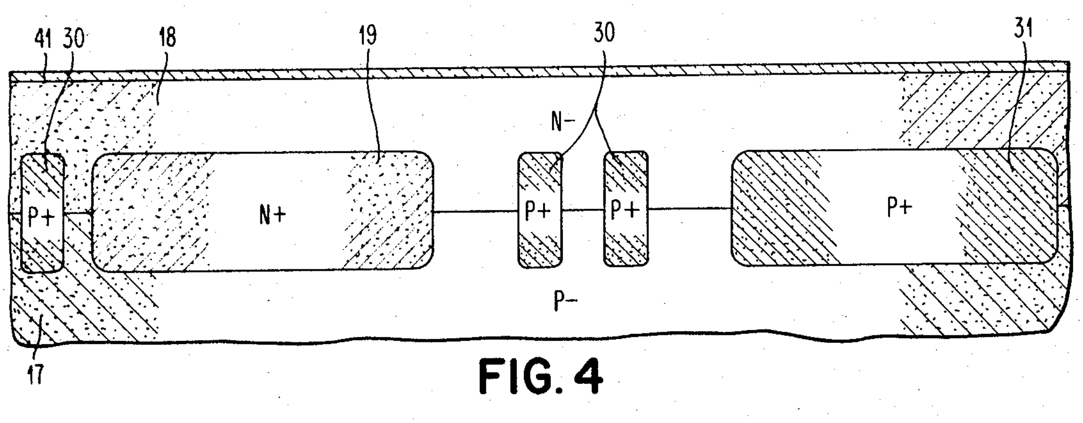

Oxide layers 14 and 20 are then stripped and a 2.2 micron thick epitaxial layer 18 of $N^-$ conductivity type is then deposited on the surface of substrate 17. During the deposition of the epitaxial layer the impurities in regions 19, 30 and 31 outdiffuse into layer 18 as illustrated in FIG. 4. A layer of silicon dioxide 41 having a thickness of about 3800 angstroms is then grown on the surface of epitaxial layer 18.

Figure 5:
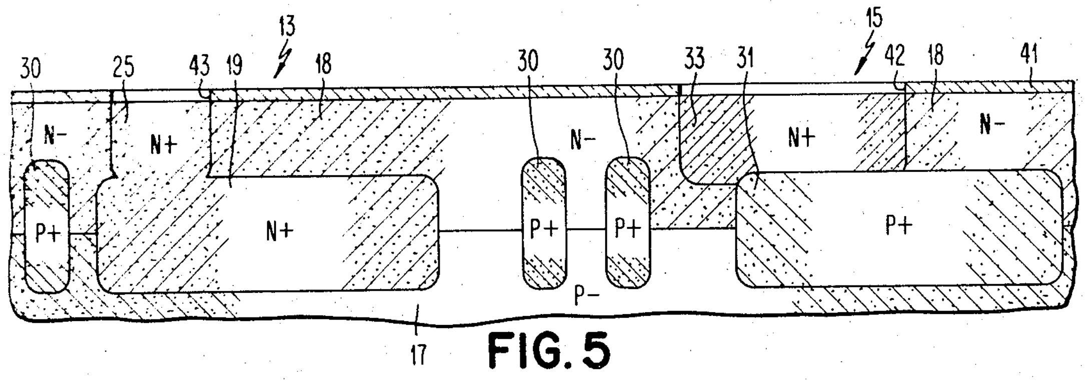
Figure 6:
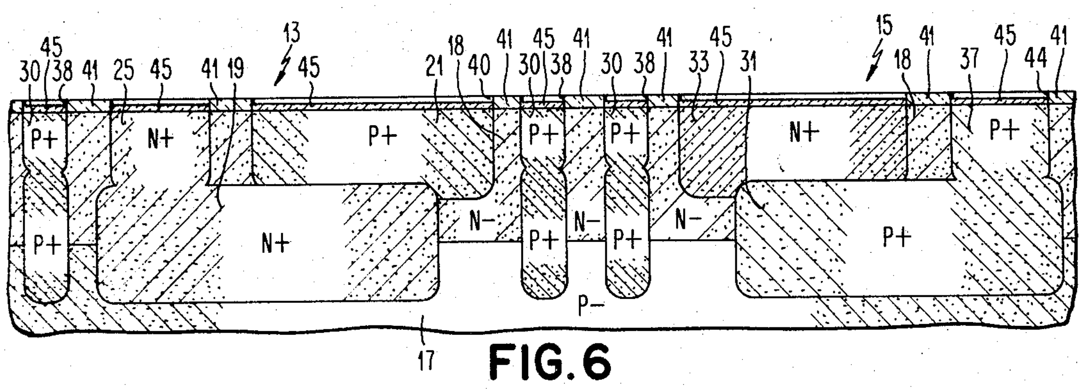
Figure 7:
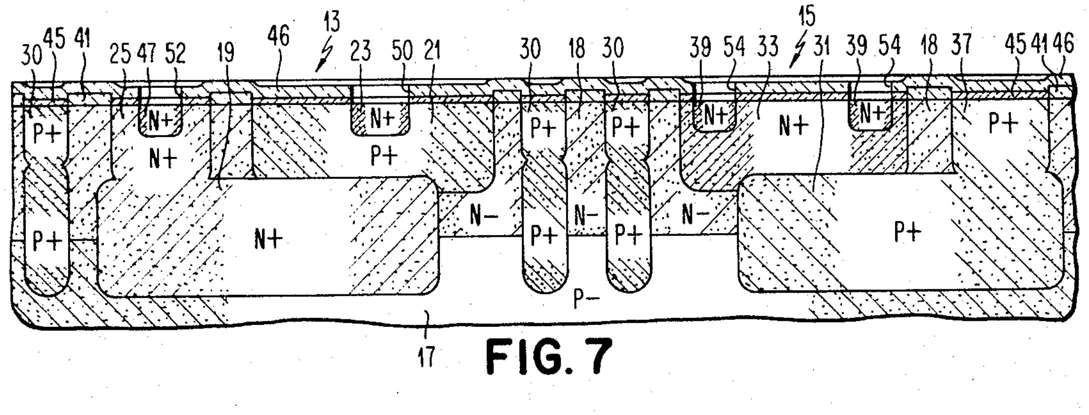
Figure 8:
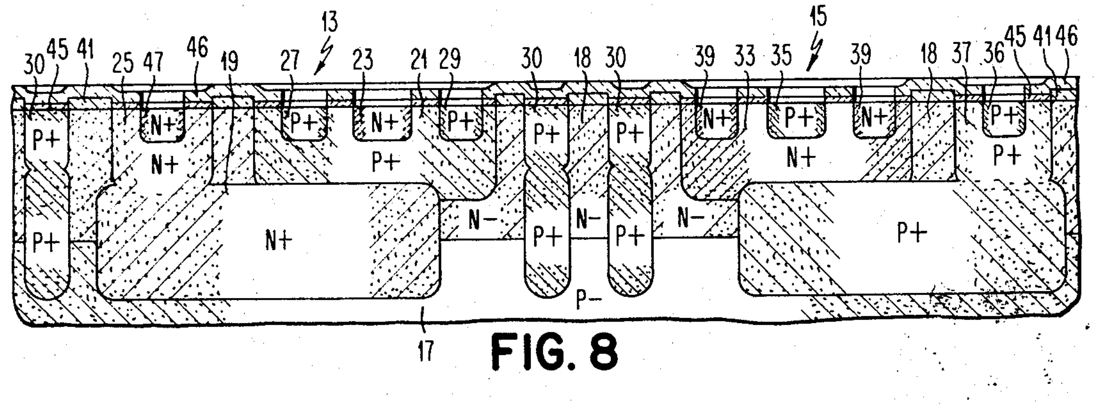

An opening 42 is made in the oxide layer 41 for the $N^+$ base diffusion of transistor 15 and an opening 43 is made for the collector contact region 25 for transistor 13 as illustrated in FIG. 5. The diffusion of $N^+$ base region 33 is then performed by diffusing phosphorus into layer 18 to provide a phosphorus concentration $$Co=9\times10^{18}\text{ a./cm.}^3$$

using a conventional capsule diffusion technique with a silicon-phosphorus source at a temperature of about 1050° C. for 175 minutes. The resulting sheet resistivity is about 260 ohm/cm.$^2$. Contact region 25 for collector 19 is formed simultaneously through opening 43 in oxide layer 41. A 3400 angstrom oxidation is then performed to close openings 42 and 43 followed by step reduction and reoxidation to a thickness of 1000 angstroms (not shown). Step reduction is introduced only for the purpose of reducing the step in the oxide over the collector and any resistor contact regions. It also results in an equal oxide thickness over the N+ emitter, the N+ collector and the N+ base contacts during the N+ emitter opening. Step reduction is done only in the areas of the collector contact of the NPN transistor, any resistor contacts, and the base contacts of the PNP transistor.

Openings 38, 40 and 44 (FIG. 6) are made in the oxide layer 41 by photolithographic and etch techniques to provide for the isolation 30, P base 21, and P collector 37 contact regions. Boron is then diffused through openings 38, 40 and 44 to provide a P+ base concentration $Co=2.5\times10^{19}$ using a conventional capsule diffusion at a temperature of about 1050° C. for about 60 minutes. The 1000 A. oxide layer grown after step reduction is then stripped and oxide layer 45 having a thickness of about 650 angstroms followed by a silicon nitride layer 46 of a thickness of about 1600 angstroms are then deposited on the surface. Openings 50, 52 and 54 for the N+ emitter 23, the N+ collector contact 47 and the N+ base contacts 39 respectively are then opened through layers 45 and 46. The N+ emitter 23 of transistor 13 and the collector contact 47 and base contacts 39 are then diffused to a concentration of $5.2\times10^{20}$ a./cm.$^3$ of arsenic using a conventional capsule diffusion at a temperature of about 1000° C. for about 110 minutes. The sheet resistivity is about 19 ohms per square centimeter. Openings for the P+ emitter 35, p+ base contacts 27 and 29, and P+ collector contacts 36 are then opened through layers 45 and 46 with all other contacts and N+ emitter 23 remaining unmasked, FIG. 8. P+ emitter 35 is then diffused to a concentration $Co=1.5\times10^{20}$ atoms/cm.$^3$ of boron using a conventional capsule diffusion at a temperature of about 1000° C. for about 23 minutes. The sheet resistivity was about 60.3 ohms/cm.$^2$. The contact metallurgy was then formed to provide the connections to form the desired circuits without need for an emitter opening step. The frequency response of the NPN and PNP transistors were determined to be 4.5 gHz. and 1.38 gHz. respectively.

It should be understood that at the same time as the NPN and PNP transistors are formed various surface and/or buried resistors, capacitors and Schottky barrier diodes as required for the desired circuit can be formed as is conventional in the art. These components can be formed simultaneously with the above diffusion steps by making appropriate openings in the masking layers.

The above process has the advantage of eliminating the need for the N+ emitter and P+ emitter contact opening step prior to metallization. This allows the contact area to be co-extensive with the emitter area which provides for optimum density and performance. In prior practice it was necessary to make the emitter slightly oversized in order to hit the contact area with the contact opening step because of mask alignment difficulties. The slightly oversized emitter has an adverse effect on frequency response and substantial misalignment during the opening step could result in device failure.

Figure 9:
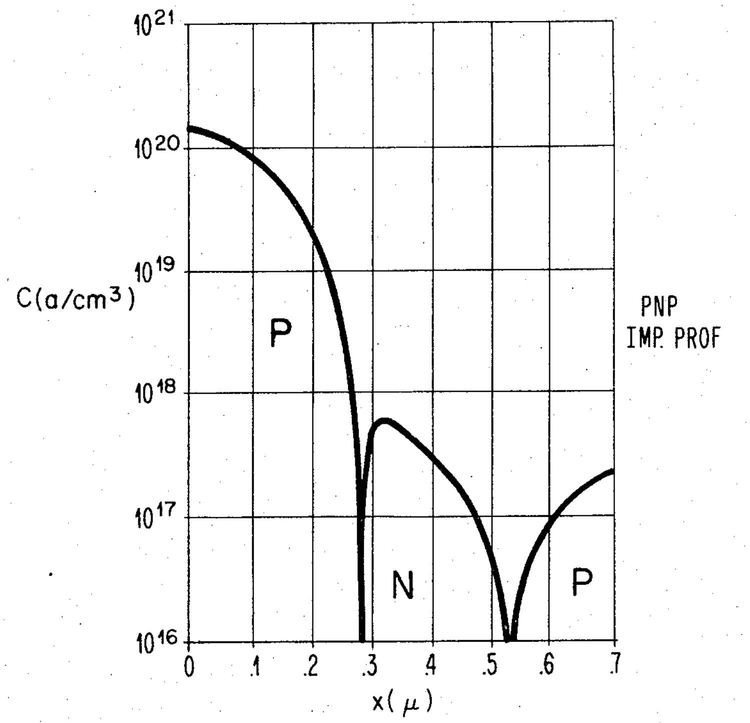
FIG. 9 is a semilogarithmic plot of the impurity profile of the PNP transistor illustrated in FIG. 1.
Figure 10:
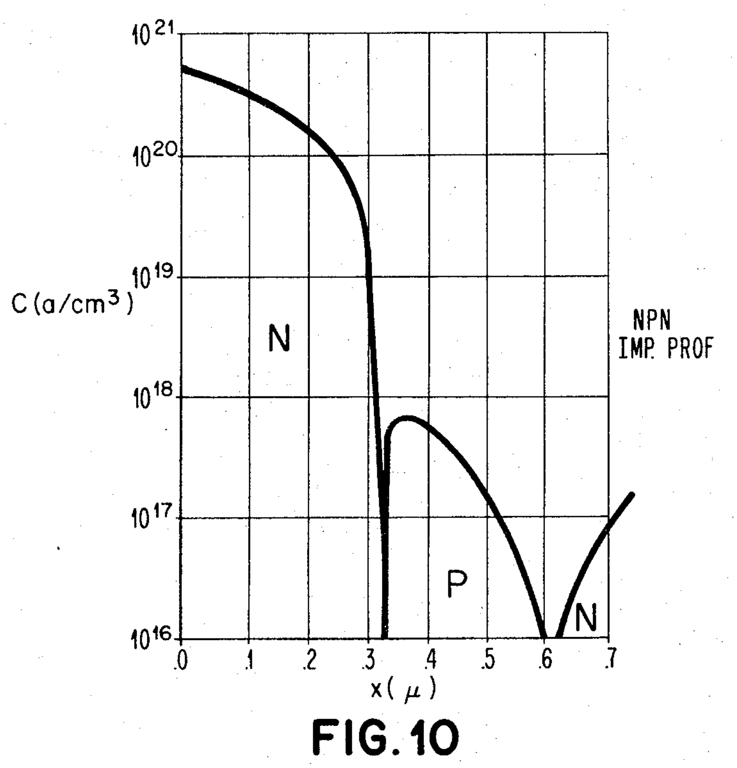
FIG. 10 is a semilogarithmic plot of the impurity profile of the NPN tranisistor illustrated in FIG. 1.

FIGS. 9 and 10 show the impurity profiles of the PNP and NPN transistors respectively. The impurity concentration and diffusion times are selected so that the impurity profile of the boron which is diffused into the open emitter area of the NPN transistor during the PNP emitter diffusion is within the concentration of arsenic in the open N+ emitter area.

It should be understood that the above process illustrates one embodiment of the invention and that other impurity profiles can be chosen within the above listed parameters in order to provide not only a variety of complementary devices having the required electrical characteristics for a given application but other circuit elements such as resistors and diodes. For example the process permits the N base diffusion concentrations to be varied from about $1.5\times10^{19}$ to about $9\times10^{18}$ to provide sheet resistivities varying from about 200 to 257 ohms per square centimeter. This permits variations in the N type resistors which are formed simultaneously with the N base diffusion.

We claim:

1. In the process of making integrated circuit devices by conducting a series of masking and diffusion steps to simultaneously form complementary transistors, the improvement which comprises performing a diffusion to form a first emitter area of one conductivity type for one transistor while leaving unmasked a second emitter area of opposite conductivity type of a complementary transistor and selecting the impurity concentrations of the emitter areas such that the conductivity type of the second emitter area remains unchanged and the excess in the concentration of the predominent impurity type in the second emitter remains in the same order of magnitude as prior to said diffusion.

2. In the process of making complementary NPN and PNP transistors by conducting a series of masking and diffusion steps to simultaneously form the two transistors, the improvement which comprises performing the P emitter diffusion of the PNP transistor so as to simultaneously diffuse the P type impurity into the unmasked N emitter area of the NPN transistor and selecting the impurity concentrations of the diffusion and the N emitter area such that the conductivity type of the N emitter area remains unchanged and the excess in the concentration of the predominant impurity type in the N emitter area remains in the same order of magnitude as prior to said diffusion.

3. The process of claim 2 wherein the contact metallization is performed following said P emitter diffusion without any intervening emitter contact opening step.

4. The process of claim 2 including the simultaneous formation of other circuit components.

5. The process of claim 4 wherein said circuit components are resistors and Schottky barrier diodes.

6. The process of claim 2 including the step of simultaneously performing the N+ base diffusion of the PNP transistor and the collector contact region of the NPN transistor.

References Cited

UNITED STATES PATENTS

| | | | |
|---|---|---|---|
| 3,575,741 | 4/1971 | Murphy | 148—175 |
| 3,449,643 | 6/1969 | Imaizumi | 148—175 X |
| 3,506,893 | 4/1970 | Dhaka | 148—175 X |
| 3,412,460 | 11/1968 | Lin | 148—175 X |

GEORGE T. OZAKI, Primary Examiner

U.S. Cl. X.R.

148—189, 175; 317—235 R; 29—577